United States Patent
De Bevilacqua et al.

(10) Patent No.: US 11,719,412 B2
(45) Date of Patent: Aug. 8, 2023

(54) LED LIGHTING DEVICE WITH LENS WITH ELLIPTIC PROFILES

(71) Applicant: ARTEMIDE S.P.A., Milan (IT)

(72) Inventors: Carlotta Francesca Isolina Maria De Bevilacqua, Milan (IT); Roberto Efrem Franzosi, Milan (IT)

(73) Assignee: ARTEMIDE S.P.A.

( * ) Notice: Subject to any disclaimer, the term of this patent is extended or adjusted under 35 U.S.C. 154(b) by 0 days.

(21) Appl. No.: 17/687,734

(22) Filed: Mar. 7, 2022

(65) Prior Publication Data

US 2022/0282851 A1    Sep. 8, 2022

(30) Foreign Application Priority Data

Mar. 8, 2021    (IT) .......................... 102021000005315

(51) Int. Cl.
    *F21V 5/04*       (2006.01)
    *F21Y 115/10*     (2016.01)

(52) U.S. Cl.
    CPC ............ *F21V 5/04* (2013.01); *F21Y 2115/10* (2016.08)

(58) Field of Classification Search
    CPC ............................. F21V 5/04; G02B 19/0061
    See application file for complete search history.

(56) References Cited

U.S. PATENT DOCUMENTS

| | | | | |
|---|---|---|---|---|
| 2009/0231846 A1* | 9/2009 | Nakajima | ............... | G02B 6/003 362/237 |
| 2010/0264432 A1* | 10/2010 | Liu | ...................... | H01L 25/0753 257/E33.056 |
| 2010/0302785 A1* | 12/2010 | Zhou | .................. | G02B 19/0028 359/727 |
| 2015/0003059 A1* | 1/2015 | Haitz | ...................... | F21V 13/08 362/235 |
| 2015/0070900 A1* | 3/2015 | Fleming | .................. | F21V 17/02 362/311.01 |
| 2015/0103533 A1* | 4/2015 | Wang He | ................. | G02B 3/00 362/335 |

FOREIGN PATENT DOCUMENTS

JP         S62139367 A     6/1987

* cited by examiner

*Primary Examiner* — Oluseye Iwarere
*Assistant Examiner* — Michael Chiang
(74) *Attorney, Agent, or Firm* — The Belles Group, P.C.

(57) ABSTRACT

An LED lighting device, extending along and about a central longitudinal axis, comprises at least one LED light source and a lens made of a transparent material, positioned along the axis; the lens having a concave inlet surface, facing the source, and a convex outlet surface, substantially aligned along the axis and extending about the axis; the inlet surface and the outlet surface have respective elliptic profiles, being defined by respective revolution surfaces generated by the rotation about the axis of respective ellipse portions belonging to a first and a second generatrix ellipses respectively.

16 Claims, 3 Drawing Sheets

LED LIGHTING DEVICE WITH LENS WITH ELLIPTIC PROFILES

CROSS-REFERENCE TO RELATED APPLICATIONS

This patent application claims priority from Italian patent application no. 102021000005315 filed on Mar. 8, 2021, the entire disclosure of which is incorporated herein by reference.

TECHNICAL SECTOR

This invention relates to an LED lighting device.

In particular, the invention relates to an LED lighting device for lighting interiors, which are capable of meeting the requirements for lighting work environments.

PRIOR ART

As known, with reference to lighting environments and, in particular, work environments, it is necessary, including to meet increasingly stringent requirements stipulated by law, that lighting devices are not just highly efficient, but also provide a high degree of visual comfort.

The known devices, in order to meet the legal requirements in terms of glare and other specifications, are, in turn, penalised in terms of optical performance, and/or are relatively complex and/or bulky.

SUBJECT OF THE INVENTION

One purpose of this invention is, therefore, to provide an LED lighting device making it possible to overcome the drawbacks highlighted here in the prior art.

In particular, one purpose of the invention is to provide an LED lighting device that is extremely compact, simple, and highly efficient, able to emit light with a high degree of visual comfort, without therefore creating glare, at least within the limits of the regulations in force, and, at the same time, with very high optical performance.

This invention relates, therefore, to an LED lighting device as defined in the attached claim 1.

Additional preferred features of the invention are defined in the dependent claims.

The LED lighting device of the invention is extremely compact, simple, and highly efficient, and emits light with a high degree of visual comfort and, at the same time, with a very high optical performance, indicatively above 80%, while also complying with all regulations in force about glare and other stipulations for lighting work environments.

BRIEF DESCRIPTION OF THE DRAWINGS

Additional features and advantages of this invention will be clear from the description that follows of a non-limiting embodiment, with reference to the attached figures, in which.

PREFERRED EMBODIMENT OF THE INVENTION

Figure 1:
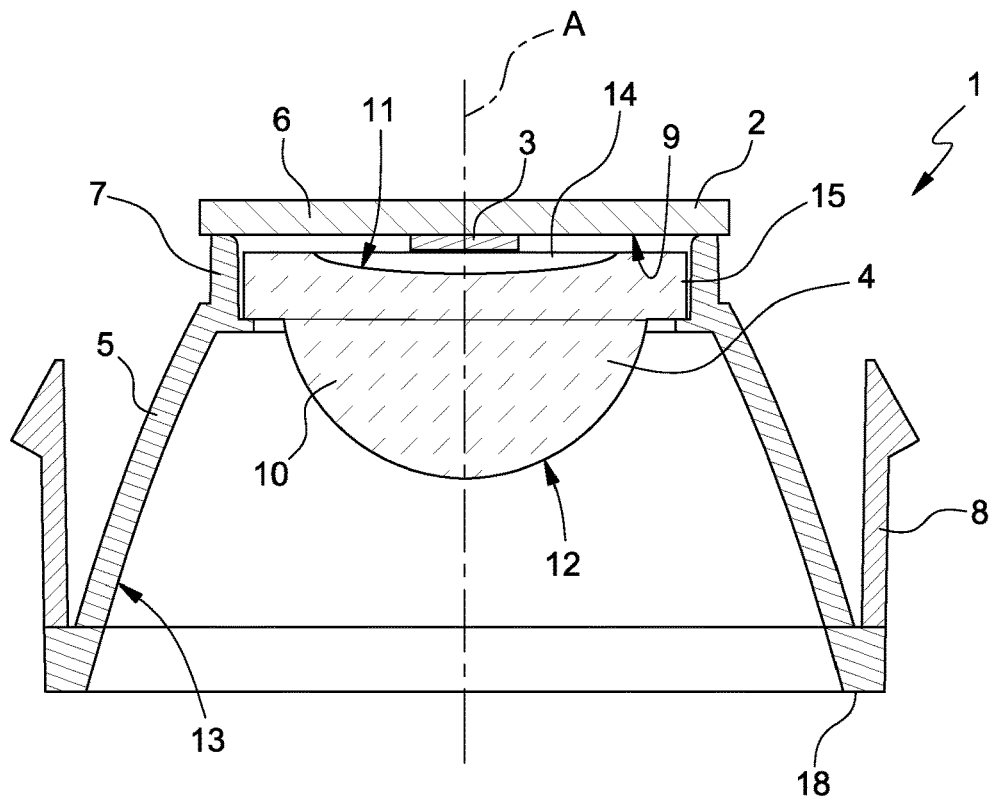
FIG. 1 is a schematic view in longitudinal cross-section of an LED lighting device in accordance with the invention.

In FIG. 1, the reference number 1 designates, as a whole, an LED lighting device for lighting environments, in particular for lighting work environments.

The device 1 extends along and about a central, longitudinal axis A and comprises a support structure 2, at least one LED light source 3, a lens 4 made of transparent material, and a shield 5.

The support structure 2, only schematically and partially shown in FIG. 1, can take on different shapes, including depending on the use of the device 1.

It is understood that the support structure 2 may be integrated into an outer case housing multiple devices 1.

In the non-limiting example shown, the support structure 2 comprises a rear wall 6, which supports the source 3, and a collar portion 7, which extends from one perimeter edge of the wall 6 and surrounds the source 3 and the lens 4 and from which the shield 5 protrudes.

The support structure 2 is optionally equipped with fixing members 8, for example snaplock tabs, to hook the device 1 into a respective seat (not illustrated).

The source 3 comprises one of more LEDs mounted on a printed circuit board, for example an SMD (LEDs mounted directly on the printed circuit board).

The source 3 is mounted centrally on one face 9 of the wall 6 along the axis A and, preferably, projects from the face 9.

The lens 4 consists of a monolithic body 10 made of transparent material, for example glass or polymer.

The body 10 is a rotation body having rotational symmetry about the axis A.

The body 10 of the lens 4 extends along and about the axis A, also defining an optical axis of the device 1.

Figure 2:
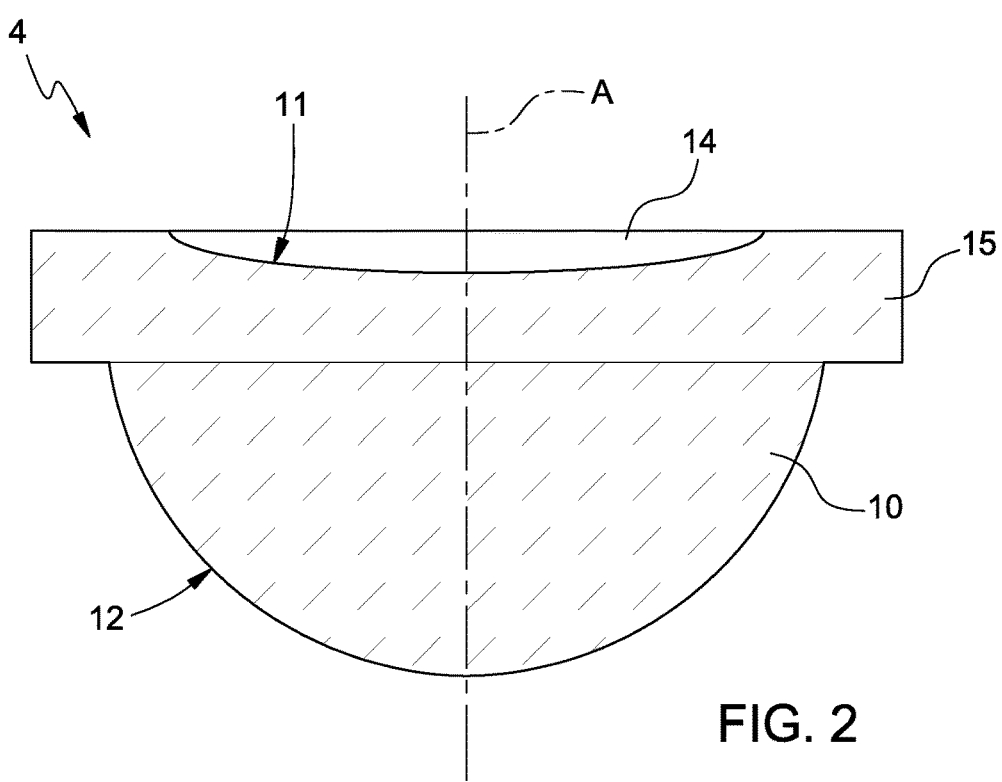
FIG. 2 is a view on an enlarged scale and in longitudinal cross-section of a component, in particular a lens, of the device in FIG. 1.
Figure 3:
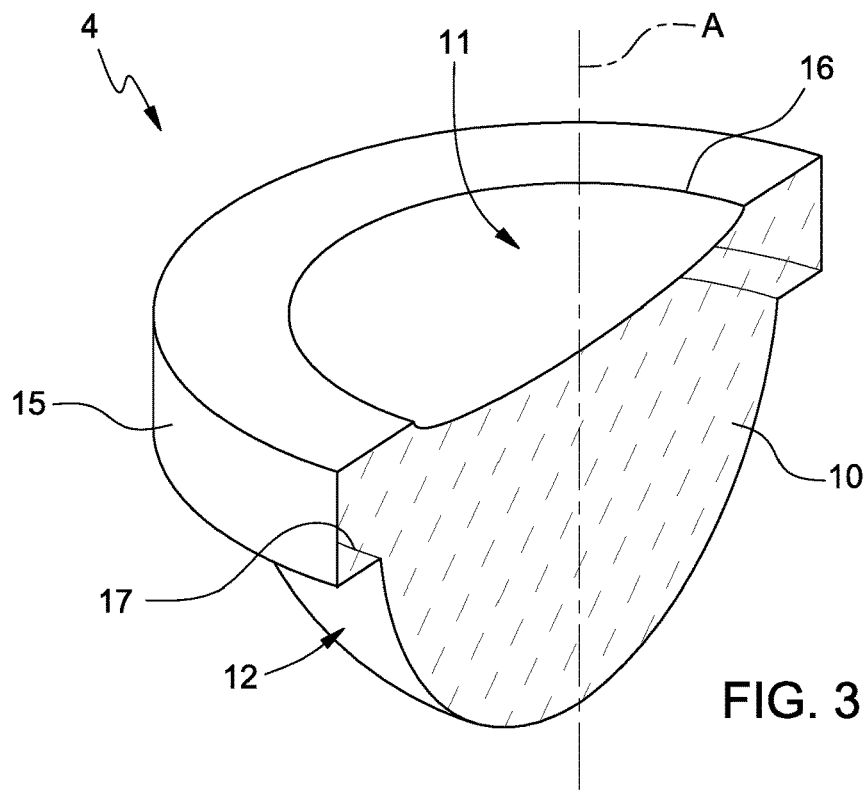
FIG. 3 is a perspective view of the lens in FIG. 2.

With reference to FIGS. 2-3 as well, the lens 4 has a concave inlet surface 11, facing the source 3; and a convex outlet surface 12, facing a lateral inner surface 13 of the shield 5.

The inlet surface 11 and the outlet surface 12 are basically aligned along the axis A and extend about the axis A.

The inlet surface 11 is concave and defines a cavity 14 wherein the source 3 is housed. The source 3 is at least partially contained in the cavity 14.

The inlet surface 11 has a concave profile so that the totality of the light flow emitted by the source 3, housed in the cavity 14, hits the inlet surface 11 and is refracted inside the lens 4.

More specifically, the inlet surface 11 has an elliptic profile (i.e., it has the shape of an elliptic portion).

Figure 4:
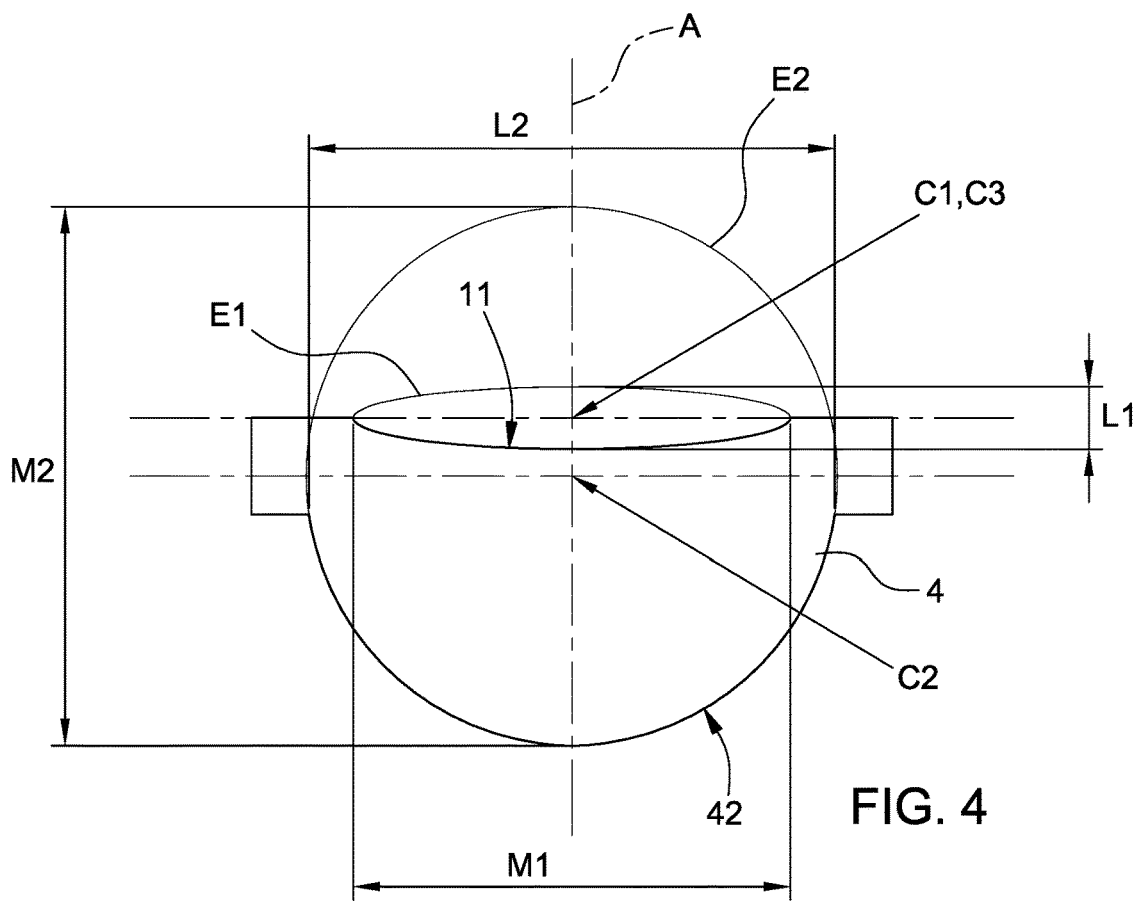
FIG. 4 is a schematic view that shows the geometric construction of the lens in FIG. 2.

In particular, as shown in FIG. 4, the inlet surface 11 is a revolution surface generated by the rotation about the axis A of an ellipse portion, for example a semi-ellipse, belonging to a first generatrix ellipse E1.

In other words, the longitudinal section of the inlet surface 11 on a meridian plane of the lens 4 (the plane containing the axis A) has the shape of an ellipse portion, in particular a semi-ellipse.

The inlet surface 11 is obtained by the rotation around the axis A of the generatrix ellipse E1 and by the intersection with a plane perpendicular to the axis A.

The ellipse E1 of the inlet surface 11 has a major axis M1 perpendicular to the axis A and a minor axis L1 parallel to the axis A. The centre C1 of the ellipse E1 is located on the axis A.

In preferred embodiments, the ellipse E1 has an eccentricity (ratio between the distance between the foci and the length of the major axis) greater than or equal to 0.80, preferably greater than or equal to 0.90 and, more preferably, greater than or equal to 0.95 (and less than 1.00, preferably less than or equal to 0.99).

The ratio between the length of the major axis M1 and the length of the minor axis L1 is, preferably, greater than or equal to 6, more preferably, greater than or equal to 7.

In the non-limiting example illustrated, the length of the major axis M1 is 14 mm and the length of the minor axis M2 is 2.0 mm.

Clearly, these are purely illustrative values.

Advantageously, the centre C1 of the ellipse E1 coincides with a geometric centre C3 of the source 3, understood as the centre of an emission surface of the source 3; or is located aligned along the axis A and at a small distance, less than 0.2 mm, from the centre C3.

The outlet surface 12 is convex and has a convex, elliptic profile (i.e., it has the shape of an ellipse portion).

In particular, as shown in FIG. 4, the outlet surface 12 is a revolution surface generated by the rotation around the axis A of an ellipse portion belonging to a second generatrix ellipse E2.

In other words, the longitudinal cross-section of the outlet surface 12 on a meridian plane of the lens 4 (plane containing the axis A) has the shape of an ellipse portion. The outlet surface 12 is obtained by the rotation around the axis A of the generatrix ellipse E2 and by the intersection with a plane perpendicular to the axis A.

The ellipse E2 of the outlet surface 12 has a major axis M2 perpendicular to the axis A and a minor axis L2 parallel to the axis A. The centre C2 of the ellipse E2 is located on the axis A, aligned with the centre C1 of the ellipse E1 and spaced longitudinally (along the axis A) therefrom.

The major axis M2 of the ellipse E2 is, preferably, parallel to the axis A and to the minor axis L1 of the ellipse E1 and perpendicular to the major axis M1 of the ellipse E1; and the minor axis L2 of the ellipse E2 is perpendicular to the axis A and to the minor axis L1 of the ellipse E1 and parallel to the major axis M1 of the ellipse E1.

The major axis M2 of the ellipse E2 has a length that is greater than the length of the major axis M1 of the ellipse E1; and the minor axis L2 of the ellipse E2 has a length that is greater than the length of the minor axis L1 of the ellipse E1.

Advantageously, the ellipse E2 has an eccentricity that is less than the ellipse E1.

In preferred embodiments, the ellipse E2 has an eccentricity (in any case greater than 0) that is lower than or equal to 0.20, preferably lower than or equal to 0.18 and more preferably lower than or equal to 0.16.

The ratio between the length of the major axis M2 and the length of the minor axis L2 is, preferably, lower than or equal to 1.20, more preferably, lower than or equal to 1.10.

In the non-limiting example illustrated, the length of the major axis M2 is 17.26 mm and the length of the minor axis L2 is 17.04 mm.

Clearly, these are purely illustrative values.

In some embodiments, the centres C1, C2 of the ellipse E1, E2 are aligned along the axis A and spaced apart from each other by a distances less than 3.0 mm, preferably less than 2.00 mm.

In other embodiments, the centres C1, C2 of the ellipses E1, E2 coincide.

Figure 5:
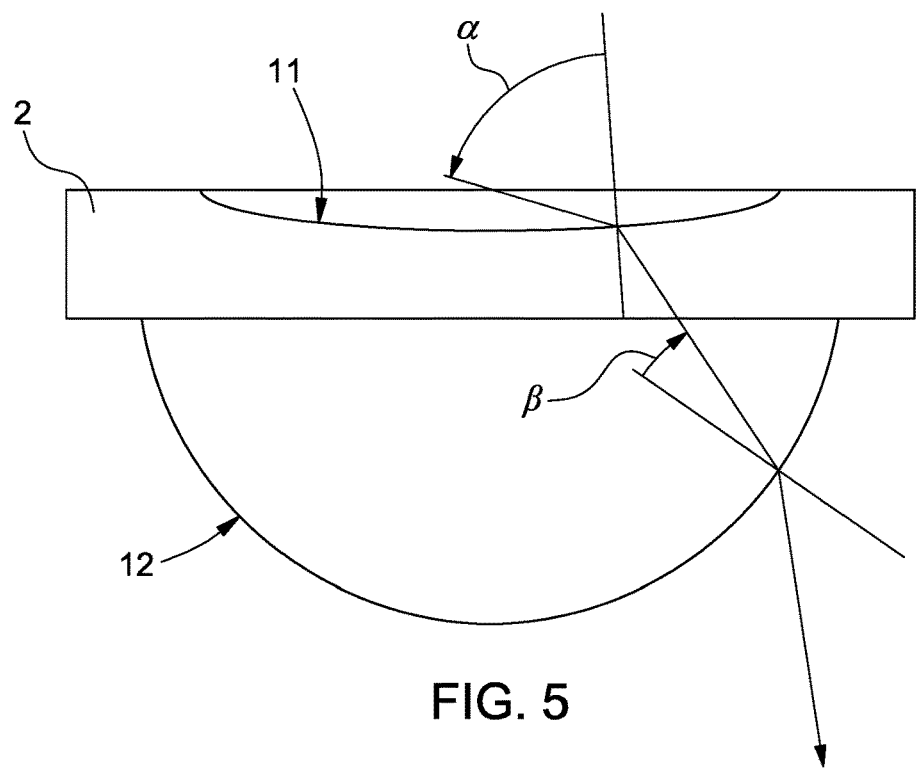
FIG. 5 is a schematic view that shows some optical features of the lens in FIG. 2.

According to the invention, as shown in FIG. 5, the inlet surface 11 is shaped so as to have a positive angle of incidence α, while the outlet surface 12 is shaped so as to have a negative angle of incidence β.

As known, in optics, the angle of incidence of a light beam in relation to a surface is defined as the flat angle formed by the light beam with the normal to the surface. In accordance with the goniometric convention, angles taken anticlockwise are positive, while angles taken clockwise are negative.

Thus, the inlet surface 11 and the outlet surface 12 are shaped so that any light beam emitted by the source 3 has a positive angle of incidence α in relation to the inlet surface 11 and a negative angle of incidence β in relation to the outlet surface 12.

The lens 3 preferably comprises a connection portion 15 connecting the inlet surface 11 and the outlet surface 12. In particular, the portion 15 is defined by a collar, for example a cylindrical one, which extends about the axis A and joins respective peripheral edges 16, 17 of the inlet surface 11 and of the outlet surface 12.

The shield 5 surrounds the lens 3 and, in particular, the outlet surface 12.

The shield 5 has a tapered shape along the axis A and widens from the collar portion 7, to which the shield 5 is joined, towards a free end 18.

Figure 6:
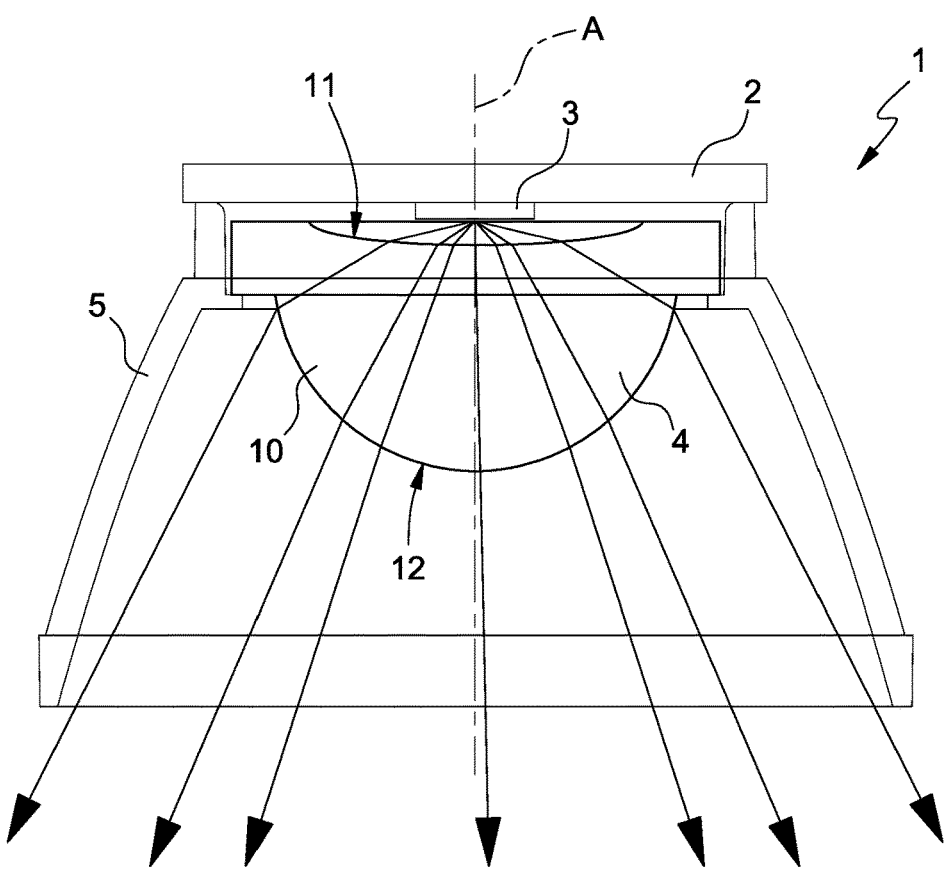
FIG. 6 is a longitudinal cross-section view of the device in FIG. 1 when in use.

In use, as shown in FIG. 6, the light beams emitted by the source 3 are all intercepted by the inlet surface 11. The inlet surface 11 is shaped and positioned so as to receive the entirety of the light beams emitted by the source 3.

The light beams are refracted by the inlet surface 11 and cross the body 10 of the lens 4, reaching the outlet surface 12 where they are refracted again.

The lens 4 and, in particular, the inlet surface 11 and the outlet surface 12 are shaped so that the light beams refracted by the inlet surface 11 reach the outlet surface 12 without additional refraction or reflection inside the body 10 of the lens 4.

Thanks to the specific configuration of the lens 4, practically the whole light flow emitted by the source 3 hits the inlet surface 11 and is refracted towards the outlet surface 12 with minimum losses, basically attributable to the absorption of the lens 4 material alone.

Having reached the outlet surface 12, the light beams are refracted, again, to the outside of the lens 4.

The lens 4 is shaped so that the outlet angles of the light beams from the outlet surface 12 are such for which the light beams do not hit the shield 5.

The shield 5 has the function of avoiding vision of the lens 4, which may appear "bright" to observers' sight due to the effect of impurities in the transparent material or due to dust deposited on the outlet surface 12.

The optical architecture of the device 1 makes it possible to obtain a very high optical performance, indicatively between 82 and 87%, in relation to laws in force regarding limiting glare and every other stipulation for lighting work environments.

Finally, it is understood that the LED lighting device described and illustrated here, may be modified, and variants thereof produced, without departing from the scope of the attached claims.

The invention claimed is:

1. A LED lighting device (1), extending along and about a central longitudinal axis (A) and comprising at least one LED light source (3) and a lens (4) made of a transparent material, positioned along the axis (A); the lens (4) having a concave inlet surface (11), facing the LED light source (3), and a convex outlet surface (12), substantially aligned along the axis (A) and extending about the axis (A); characterized in that the inlet surface (11) and the outlet surface (12) have respective elliptic profiles, being defined by respective revolution surfaces generated by the rotation about the axis (A) of respective ellipse portions belonging to a first and a second generatrix ellipses (E1, E2) respectively, wherein the second ellipse (E2) has an eccentricity lower than the first ellipse (E1) and greater than zero.

2. The device according to claim 1, wherein the first ellipse (E1) and the second ellipse (E2) have respective major axes (M1, M2) and respective minor axes (L1, L2) and the minor axis (L1) of the first ellipse (E1) and the major axis (M2) of the second ellipse (E2) are aligned with each other and parallel to the axis (A); and the major axis (M1) of the first ellipse (E1) and the minor axis (L2) of the second ellipse (E2) are parallel to each other and perpendicular to the axis (A).

3. The device according to claim 2, wherein the minor axis (L2) of the second ellipse (E2) has a length greater than both the length of the minor axis (L1) and the length of the major axis (M1) of the first ellipse (E1).

4. The device according to claim 2, wherein the minor axis (L2) of the second ellipse (E2) has a length greater than the length of the major axis (M1) of the first ellipse (E1).

5. The device according to claim 1, wherein the first ellipse (E1) has an eccentricity greater than or equal to 0.80, or greater than or equal to 0.90, or greater than or equal to 0.95.

6. The device according to claim 1, wherein the second ellipse (E2) has an eccentricity lower than or equal to 0.20, or lower than or equal to 0.18, or lower than or equal to 0.16.

7. The device according to claim 1, wherein the lens (4) comprises a monolithic body (10) made of a transparent material having rotational symmetry about the axis (A).

8. The device according to claim 7, wherein the transparent material is at least one of: glass, or a polymer material.

9. The device according to claim 1, wherein the inlet surface (11) defines a cavity (14) in which the LED light source (3) is housed at least partially; and has a concave profile such that the whole luminous flux emitted by the LED light source (3), housed in the cavity (14), impinge on the inlet surface (11) and is refracted inside the lens (4).

10. The device according to claim 1, wherein the first ellipse (E1) has a centre (C1) that coincides with a geometric centre (C3) of the LED light source (3); or it is aligned along the axis (A) and at a short distance, lower than 0.20 mm, from the geometric centre (C3) of the LED light source (3).

11. The device according to claim 1, wherein the first and the second ellipses (E1, E2) have respective centres (C1, C2) aligned along the axis (A) and coinciding, or spaced apart from each other of a distance lower than 3.00 mm, or lower than 2.00 mm.

12. The device according to claim 1, wherein the lens (3) comprises a connection portion (15) joining respective peripheral edges (16, 17) of the inlet surface (11) and of the outlet surface (12).

13. The device according to claim 1, comprising a shield (5) surrounding the outlet surface (12) of the lens (3) and having a tapered shape along the axis (A), broadening towards a free end (18).

14. The device according to claim 13, wherein the lens (4) is shaped so as the light beams refracted by the inlet surface (11) reach the outlet surface (12) without further refraction or reflection inside the lens (4); and so as that the light beams exiting from the outlet surface (12) do not impinge on the shield (5).

15. The device according to claim 1, wherein the inlet surface (11) is shaped and positioned so as to receive the entirety of the light beams emitted by the LED light source (3).

16. The device according to claim 1, wherein the inlet surface (11) is shaped so as to have a positive angle of incidence ($\alpha$), while the outlet surface (12) is shaped so as to have a negative angle of incidence ($\beta$).

\* \* \* \* \*